(12) United States Patent
Balasubramanian et al.

(10) Patent No.: US 9,184,764 B1
(45) Date of Patent: Nov. 10, 2015

(54) HIGH-SPEED LOW-LATENCY CURRENT-STEERING DAC

(71) Applicant: The United States of America as represented by the Secretary of the Air Force, Washington, DC (US)

(72) Inventors: Sidharth Balasubramanian, Columbus, OH (US); Waleed Khalil, Dublin, OH (US); Vipul J. Patel, Dayton, OH (US)

(73) Assignee: The United States of America as represented by the Secretary of the Air Force, Washington, DC (US)

( * ) Notice: Subject to any disclaimer, the term of this patent is extended or adjusted under 35 U.S.C. 154(b) by 0 days.

(21) Appl. No.: 14/479,400

(22) Filed: Sep. 8, 2014

(51) Int. Cl.
*H03M 1/66* (2006.01)
*H03M 1/68* (2006.01)
(52) U.S. Cl.
CPC ............... *H03M 1/68* (2013.01); *H03M 1/664* (2013.01)
(58) Field of Classification Search
CPC ....... H03M 1/745; H03M 1/742; H03M 1/66; H03M 1/46; H03M 1/068; H03M 1/68
USPC .................................................. 341/144, 145
See application file for complete search history.

(56) References Cited

U.S. PATENT DOCUMENTS

| | | | |
|---|---|---|---|
| 6,980,779 B2 * | 12/2005 | Shakeshaft et al. | 455/127.1 |
| 7,042,379 B2 | 5/2006 | Choe | |
| 7,256,646 B2 | 8/2007 | Eid et al. | |
| 7,355,479 B2 | 4/2008 | Van Der Heijden | |
| 2009/0195425 A1 * | 8/2009 | Eloranta et al. | 341/144 |

OTHER PUBLICATIONS

Heydari, P.; Mohanavelu, R, "Design of ultrahigh-speed low-voltage CMOS CML buffers and latches," Very Large Scale Integration (VLSI) Systems, IEEE Transactions on, vol. 12, No. 10, pp. 1081-1093, Oct. 2004.
Wei-Hsin Tseng; Chi-Wei Fan; Jieh-Tsorng Wu;, "A 12-Bit 125-GS/s DAG in 90 nm CMOS With > 70 dB SFDR up to 500 MHz," Solid-State Circuits, IEEE Journal of, vol. 46, No. 12, pp. 2845-2856, Dec. 2011.
Balasubramanian, "Studies on High-Speed Digital-to-Analog Conversion," Electronic Thesis or Dissertation, The Ohio State University, May 2014.

* cited by examiner

*Primary Examiner* — Jean B Jeanglaude
(74) *Attorney, Agent, or Firm* — AFMCLO/JAZ; Jason Sopko

(57) ABSTRACT

A digital to analog converter (DAC) includes a quantity of N cells including a Least Significant Bit (LSB) cell, a Most Significant Bit (MSB) cell and, N−2 cells ordered therebetween. Each of the N cells is configured to carry a current of I, 2*I, 4*I, 8*I, ..., 2^(N−1)*I, respectively. At least the LSB cell includes a first cell element and a second cell element driven by a first current input and a second current input, respectively. A difference between a magnitude of the first current input and a magnitude of the second input current is approximately equal to I.

8 Claims, 5 Drawing Sheets

HIGH-SPEED LOW-LATENCY CURRENT-STEERING DAC

RIGHTS OF THE GOVERNMENT

The invention described herein may be manufactured and used by or for the Government of the United States for all governmental purposes without the payment of any royalty.

FIELD OF THE INVENTION

The present invention relates generally to digital to analog converters and, more particularly, to high-speed high-resolution variants thereof.

BACKGROUND OF THE INVENTION

A Digital to Analog Converter (DAC) is a circuit that converts digital measures of signal amplitude in discrete steps, into a continuous analog electrical equivalent of the signal to be reproduced. The amplitude is a digital number (for example, a 16 bit word) and the steps occur based on the sampling rate (for example, 44,100 times per second). This process can be seen as an approximation of mathematical integration, wherein tops of bars having fixed width and discrete height (digital amplitudes at a fixed sample rate) are used to approximate an analog curve or signal. In such a system, the number of discrete heights defines the DAC's resolution, and the width of each bar is determined by the sampling rate. The goal of the DAC is to adjust the top of each discrete bar to coincide with the level specified by the signal. Some techniques used to accomplish this include; Delta Sigma, Ladder, and the Most Significant Bit (MSB) Sign Magnitude Ladder, and each has its own limitations and post filtering requirements.

In the Delta Sigma DACs (single bit), each bar is raised to the appropriate level by selecting from evenly spaced, discrete intervals. For example, the maximum bar height could be segmented into 64 pieces for a 64 times oversampling system. By stacking or summing the discrete and identical increments, an approximation of each analog signal amplitude at a given sample is approximated. By tracking the error and by alternately exceeding or underrepresenting the analog signal over a large number of samples, good accuracy can be achieved, but only with appropriate post filtering and curve shaping techniques.

In a Ladder DAC, the height of each sample bar is established by summing together a plurality of discrete increments, but the DAC has several distinct height increments to choose from. By summing together an appropriate number of varied discrete height blocks, the overall height of a sample can be represented very accurately without post filtering. However, the accuracy is a function of the cumulative error of each of the discrete stacked increments that are summed.

In MSB Sign Magnitude Ladder DAC, operation is similar to the Ladder DAC method, however all bars are essentially prefilled to a height that is centered upon the expected range of the represented. Thereafter, the DAC sums together an appropriate number of varied discrete height blocks, and then either adds or subtracts from the starting centered bar height. In this way, a fewer number of segments must be added together, thus reducing the cumulative error when representing magnitudes near the centered value.

The digital input of a DAC may encode to either of a corresponding voltage, current, or charge signal. Current encoding DACs constructed in CMOS or bipolar technologies (including III-V and HBT) offer the benefit of relatively fast switching speeds, owing to the fact that the CMOS and bipolar junction transistors are inherently current-mode devices. The current encoding DAC, otherwise known as current-steering DACs, include an array of current cells, scaled (or weighted) in a binary fashion. For example, an N-bit current steering DAC comprises N current cells, each carrying current of I, 2*I, 4*I, 8*I, . . . , 2^(N-1)*I, respectively. While current encoding DACs offer the benefit of relatively fast switching speeds, several limitations and design constraints exist.

In high resolution DAC designs, there exists a large ratio between the current magnitudes of the LSB and MSB cells. In an N-bit DAC, the MSB current cell array sinks $2^{N-1}$ times the LSB current. For example, where the cell switches the current between I and 0, a conventional current steering cell may be established as depicted in FIG. 1. The difference in currents is the effective current, I. For the LSB cell, this current is $I_{LSB}$, while for the MSB of an N-bit DAC, the magnitude of this current is $2^{N-1} I_{LSB}$.

This creates a significant difference in the response times of the LSB cell (Ц LSB) and the MSB cell (Ц MSB), resulting in mismatch in switching time instants, as depicted in FIG. 2. Such cell by-cell timing delays result in the formation of output glitches that can limit the speed of operation, especially in gigahertz DACs. This creates a designer's paradox that may be referred to as the Resolution-Bandwidth trade-off.

Some older methods to improve switching speeds included adopting segmentation of the current cells, such that the highest magnitude of the MSB current was made comparable to that of the LSB cell. Such high degrees of segmentation help alleviate timing mismatch problem at the penalty of increased occupied chip footprint and increased capacitance. A large chip area results in being sensitive to process variations and IR drops that affect the matching between the current cells, both temporally and spatially. Consequently, the limitations encountered by the Resolution-Bandwidth trade-off still come into play when such prior art solution are employed.

Other methods attempt to improve the dynamic performance of the DAC by the use of return-to-zero and random return-to-zero structures. However, in such prior art structures and methods the realized performance is still limited by the intrinsic switching speeds of the current cells. While the switching speeds have been shown to improve by the use of appropriate gate drives and switching loads, design flexibility is still substantially constrained.

Therefore, there exists a need in the art for a high-speed low-latency high-resolution digital to analog converter that reduces the impact of existing Resolution-Bandwidth design limitations.

SUMMARY OF THE INVENTION

The present invention overcomes the foregoing problems and other shortcomings, drawbacks, and challenges of designing DACs with high speed and high resolution. While the invention will be described in connection with certain embodiments, it will be understood that the invention is not limited to these embodiments. To the contrary, this invention includes all alternatives, modifications, and equivalents as may be included within the spirit and scope of the present invention. The use of CMOS in the illustrations is only for the purpose of simplicity and does not limit the use of the invention in other process technologies (III-V and HBT, such as SiGe, GaN, GaAs, etc.)

According to one embodiment of the present invention, a digital to analog converter (DAC) is provided. The DAC includes a quantity of N cells including a Least Significant Bit (LSB) cell, a Most Significant Bit (MSB) cell and, N−2 cells ordered therebetween. Each of the N cells is configured to carry a current of I, 2*I, 4*I, 8*I, . . . , 2^(N−1)*I, respectively. At least the LSB cell includes a first cell element and a second cell element driven by a first current input and a second current input, respectively. A difference between a magnitude of the first current input and a magnitude of the second input current is approximately equal to I.

According to another embodiment of the present invention, a method for improving switching speeds in high resolution Digital to Analog Converters (DACs) is provide. The method includes providing a quantity of N cells including a Least Significant Bit (LSB) cell, a Most Significant Bit (MSB) and, N−2 cells ordered therebetween. Each of the N cells is configured to carry a current of I, 2*I, 4*I, 8*I, . . . , 2^(N−1)*I, respectively. The method further includes fragmenting the Least Significant Bit cell into a first cell element and a second cell element, applying a first current input having a magnitude in a similar order of magnitude as the current carried by the MSB, and applying a second current input having a magnitude in a similar order of magnitude as the current carried by the MSB. The difference between the magnitude of the first current input and the magnitude of the second current input approximately equals I.

According to a further embodiment of the disclosed invention, a method for improving switching speeds in high resolution Digital to Analog Converters (DACs) is provided. The method includes providing a quantity of N cells including a Least Significant Bit (LSB) cell, a Most Significant Bit (MSB) cell and, N−2 cells ordered therebetween. Each of the N cells is configured to carry a differential current. The method further includes fragmenting at least one cell into a first cell element and a second cell element, and applying a first current input having a magnitude larger than the differential current, and applying a second current input having a magnitude larger than the differential current. The difference between the magnitude of the first current input and the magnitude of the second current input approximately equals the differential current.

Additional objects, advantages, and novel features of the invention will be set forth in part in the description which follows, and in part will become apparent to those skilled in the art upon examination of the following or may be leaned by practice of the invention. The objects and advantages of the invention may be realized and attained by means of the instrumentalities and combinations particularly pointed out in the appended claims.

BRIEF DESCRIPTION OF THE DRAWINGS

The accompanying drawings, which are incorporated in and constitute a part of this specification, illustrate embodiments of the present invention and, together with a general description of the invention given above, and the detailed description of the embodiments given below, serve to explain the principles of the present invention.

It should be understood that the appended drawings are not necessarily to scale, presenting a somewhat simplified representation of various features illustrative of the basic principles of the invention. The specific design features of the sequence of operations as disclosed herein, including, for example, specific dimensions, orientations, locations, and shapes of various illustrated components, will be determined in part by the particular intended application and use environment. Certain features of the illustrated embodiments have been enlarged or distorted relative to others to facilitate visualization and clear understanding. In particular, thin features may be thickened, for example, for clarity or illustration.

DETAILED DESCRIPTION OF THE INVENTION

The disclosed invention helps mitigate the resolution bandwidth trade-off and achieve high-switching speeds at higher DAC resolutions. Embodiments of the disclosed invention exploit a phenomenon whereby DAC gates usually switch with higher speed when driven by larger currents. This concept is applied in such a way as to take advantage of the increased switching speed even in the LSB or other low order bits.

Figure 1:
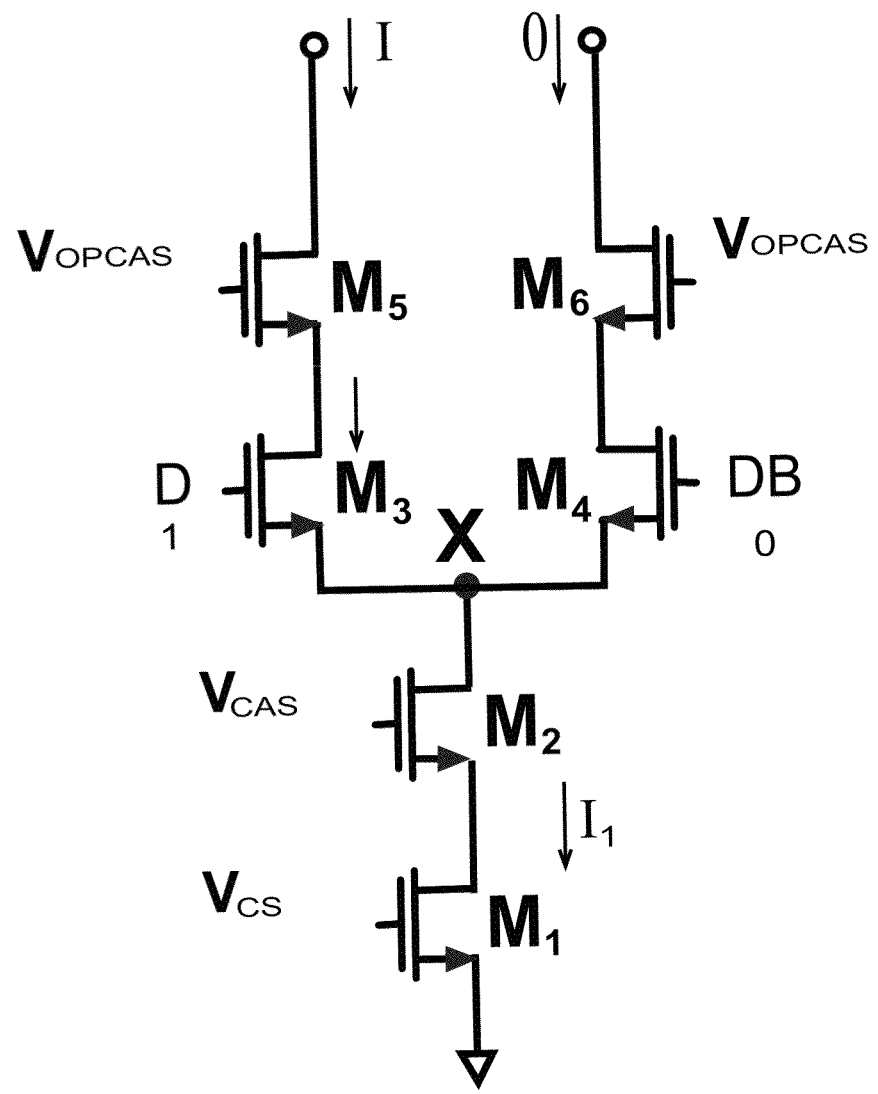
FIG. 1 is a schematic view of a prior art DAC cell.
Figure 2:
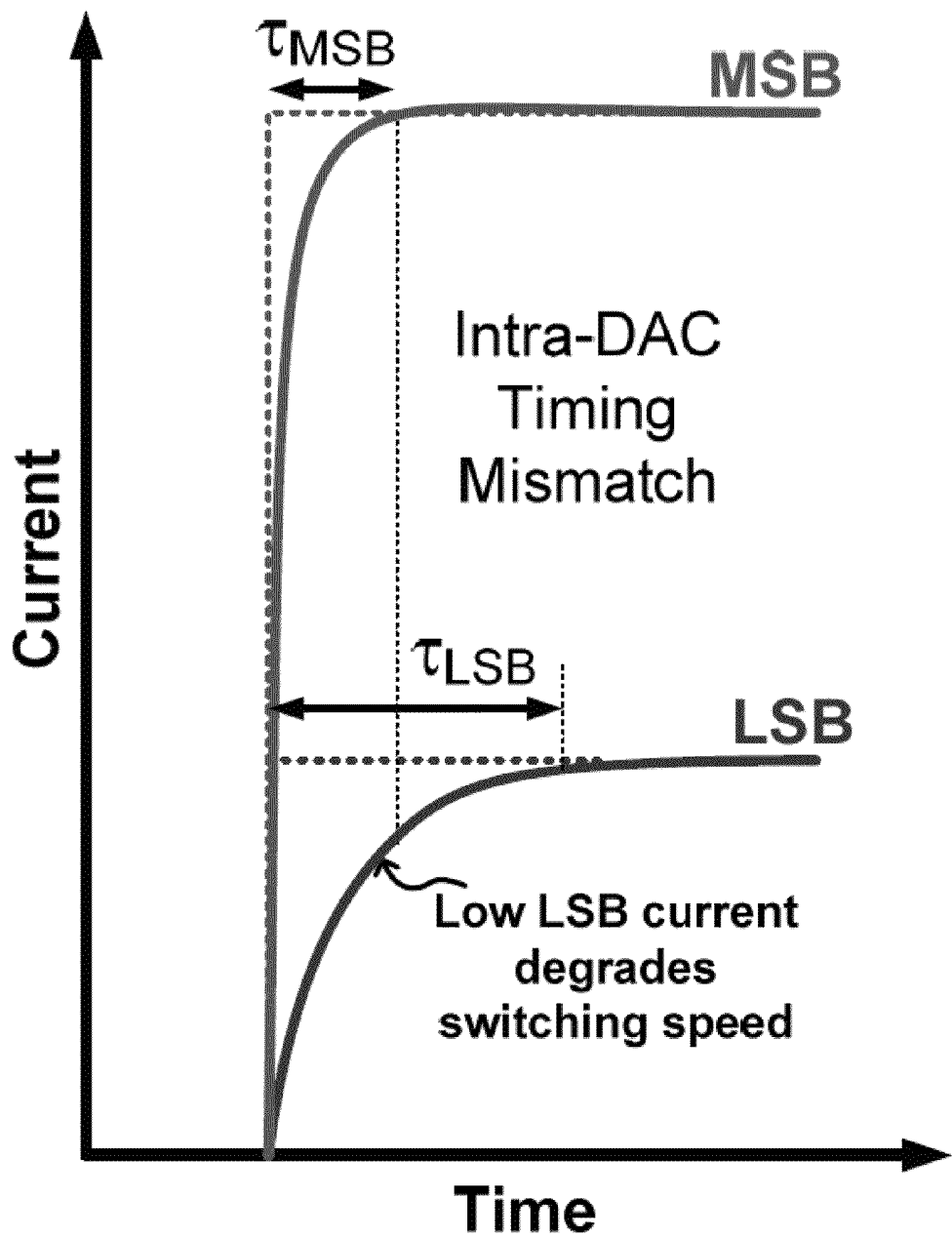
FIG. 2 is a graph illustrating an internal timing mismatch between the LSB and MSB of the prior art DAC.
Figure 3:
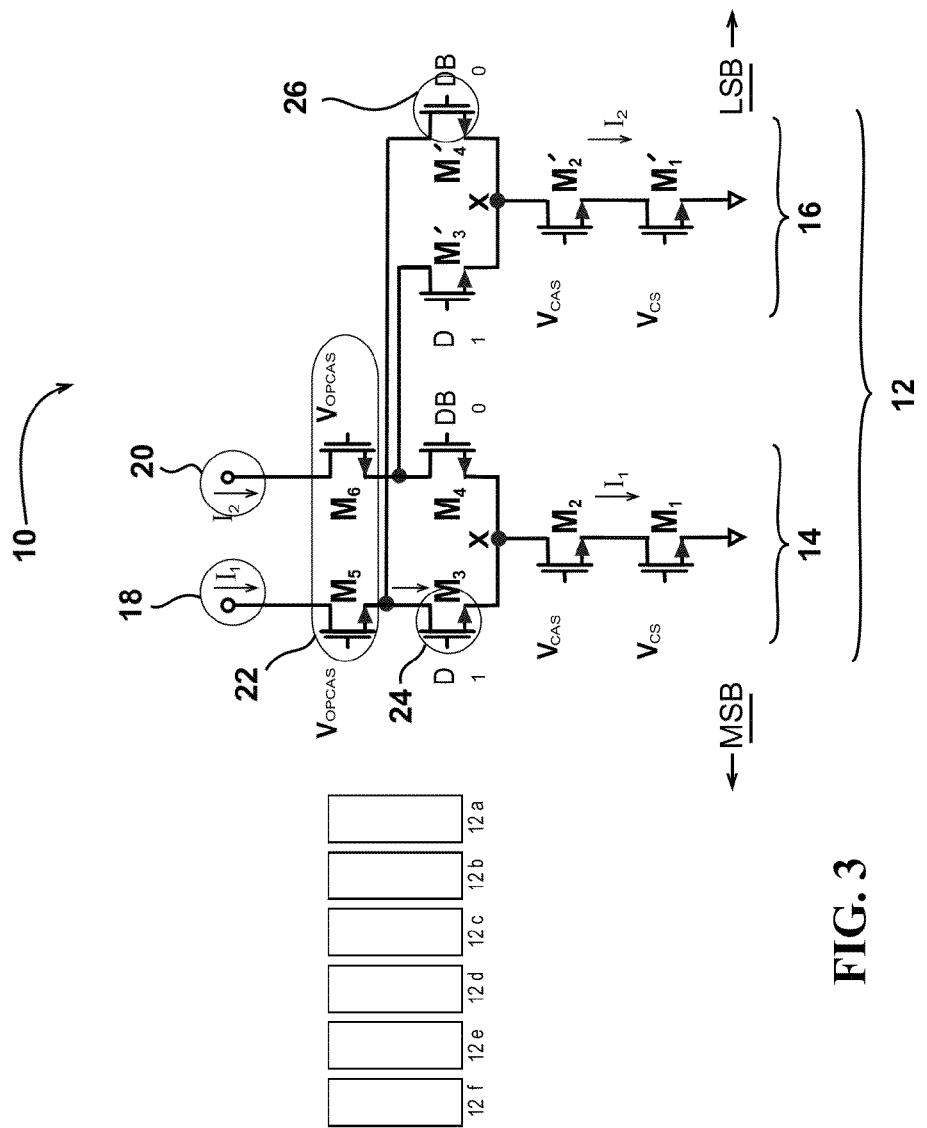
FIG. 3 is a schematic view including an improved DAC cell according to an embodiment of the disclosed invention.
Figure 3:
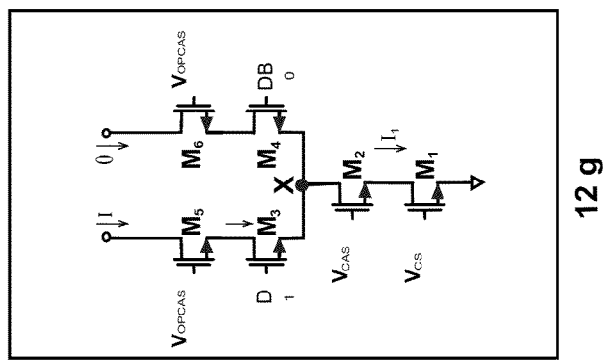
Figure 4:
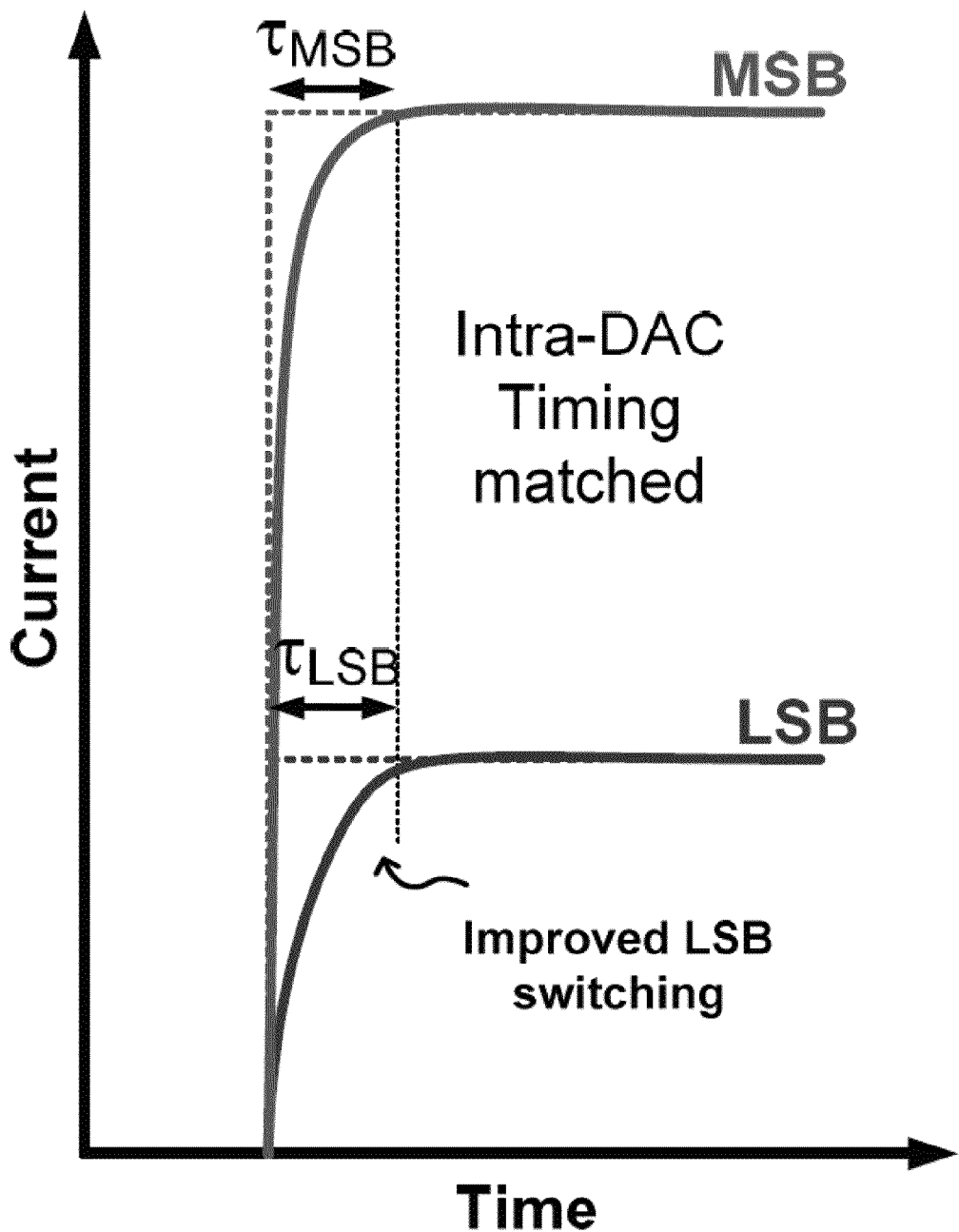
FIG. 4 is a graph illustrating improved internal timing alignment between the LSB and MSB of and embodiment of the disclosed invention.

Turning attention to FIG. 3, a cell 12 according to an embodiment of the disclosed DAC 10 is shown. The cell 12 includes a first cell element 14 and a second cell element 16. Each of the first cell element 14 and the second cell element 16 share a first current input 18 and a second current input 20. One or more cascode transistors 22 may be included to improve the output impedance. The difference in currents of cells 14 and 16 will constitute the minimum LSB current, while the magnitudes of the current in cells 14 and 16 will be comparable to the magnitude of the currents in one of the MSB cells 12$f$ or 12$g$. The absolute values of I1 and I2, to yield the desired difference of a cell current magnitude is chosen based on tolerable power specifications and current-handling capabilities of the transistors. This results in the switching speeds or timing of a cell 12 having the disclosed first cell element 14 and second cell element 16, to be matched or in the same or similar order as the switching speed of the MSB cell 12$g$. For the purposes of this invention, two magnitudes are similar in order when one magnitude is within approximately ten times the value of another magnitude.

Since the proposed invention processes difference in relatively large switching currents, as opposed to switching a large current and zero current, higher resolution high-speed DACs may be designed without sacrificing the maximum possible switching speed. In many instances, this circumvents the inherent Resolution-Bandwidth trade-off. However, the achievable speeds are limited to the unit gain frequency (fT) of the process technology.

The proposed invention can be used standalone for all current cells in a DAC, or can be used in conjunction with the conventional current cell, and create a hybrid of current cells to make a current-mode DAC.

Furthermore, when the gate 24 switches from low to high, a rising switching glitch is created at its drain. This occurs as a result of feed-through from its gate-drain capacitance. At the same time, the falling pulse at the drain of gate 26 creates a falling glitch at the same node (since their drains are connected.) For fairly similar current magnitudes in 14 and 16, the opposing glitch activity nearly cancels each other, resulting in an almost glitch-free switching output. Thus, the proposed invention acts as a neutralization cell to remove switching glitches, without the need for additional neutralization circuit.

As will be recognized by one of ordinary skill in the art, the improved switching improvement is most profound when the disclosed first cell element 14 and second cell element 16 are applied to the LSB. Since each of N cells of the disclosed invention carries a differential current of I, 2*I, 4*I, 8*I, ..., 2^(N−1)*I, currents in the LSB are most disparate from the higher driving currents of the MSB. Nonetheless, depending on performance objectives, a plurality of cells 12a through 12g may include the disclosed first cell element 14 and second cell element 16. Likewise, while it is contemplated that many configurations will include the disclosed first cell element 14 and second cell element 16 applied to the LSB, certain design constraints may result in omission of the technology from the LSB, while applying the technology to one or more other cells. While significant gains in performance are achieved when the first cell element 14 and second cell element 16 are driven at currents near the differential current of the MSB, performance may be enhanced by driving the first element 14 and second element 16 of a given cell at arbitrary currents that are larger than the differential current of that given cell.

The following examples illustrate particular properties and advantages of some of the embodiments of the present invention. Furthermore, these are examples of reduction to practice of the present invention and confirmation that the principles described in the present invention are therefore valid but should not be construed as in any way limiting the scope of the invention.

Figure 5:
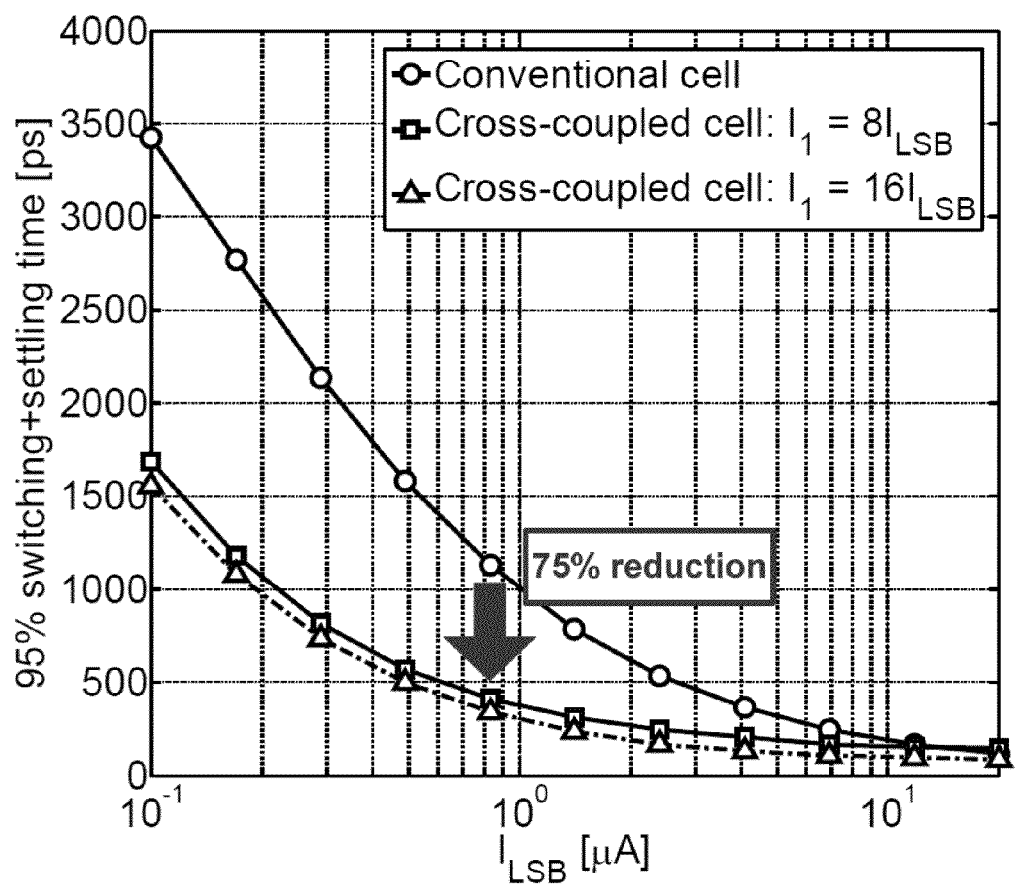
FIG. 5 is a graph illustrating simulated test results of an embodiment of the disclosed invention.

Simulation results graphing two embodiments of the disclosed DAC 10, as compared with a conventional cell, are shown in FIG. 5. A 95% value was established as the threshold for a completed switching operation. As can be seen in the figure, the LSB cell 12 of both an 8 bit and a 16 bit DAC 10, denoted by the trace superimposed with squares and triangles, respectively, yields approximately 75% faster switching times than the conventional cell, denoted by the trace superimposed with circles.

While the present invention has been illustrated by a description of one or more embodiments thereof and while these embodiments have been described in considerable detail, they are not intended to restrict or in any way limit the scope of the appended claims to such detail. Additional advantages and modifications will readily appear to those skilled in the art. The invention in its broader aspects is therefore not limited to the specific details, representative apparatus and method, and illustrative examples shown and described. Accordingly, departures may be made from such details without departing from the scope of the general inventive concept.

What is claimed is:

1. A digital to analog converter (DAC), the DAC comprising:
   a quantity of N binary cells including a Least Significant Bit (LSB) cell, a Most Significant Bit (MSB) cell and, N−2 cells ordered therebetween, wherein each of the N cells is configured to carry a current of I, 2*I, 4*I, 8*I, ..., 2^(N−1)*I, respectively;
   wherein at least the LSB cell includes a first cell element and a second cell element driven by a first current input and a second current input, respectively, and wherein a difference between a magnitude of the first current input and a magnitude of the second current input is approximately equal to I.

2. The DAC of claim 1, wherein at least one cell in addition to the LSB cell includes a third cell element and a fourth cell element driven by a third current input and a fourth current input, respectively, wherein the difference between a magnitude of the third current input and a magnitude of the fourth current input current is approximately equal to, 2^(N−1)*I.

3. A method for improving switching speeds in high resolution Digital to Analog Converters (DACs), the method comprising:
   providing a quantity of N cells including a Least Significant Bit (LSB) cell, a Most Significant Bit (MSB) and, N−2 cells ordered therebetween, wherein each of the N cells is configured to carry a current of I, 2*I, 4*I, 8*I, ..., 2^(N−1)*I, respectively;
   fragmenting the Least Significant Bit cell into a first cell element and a second cell element, applying a first current input having a magnitude in a similar order of magnitude as the current carried by the MSB and applying a second current input having a magnitude in a similar order of magnitude as the current carried by the MSB; and
   wherein the difference between the magnitude of the first current input and the magnitude of the second current input approximately equals I.

4. The method of claim 3, wherein the DAC is a segmented or thermometer type configuration.

5. The method of claim 3, further including the step of fragmenting at least one cell in addition to the LSB cell into a third current input and a fourth current input;
   selecting a magnitude of the third current input and a magnitude of the fourth current input in a similar order to the current carried by the MSB; and
   wherein the difference between the magnitude of the third current input and the magnitude of the fourth current input is approximately equal to, 2^(N−1)*I.

6. The method of claim 5, wherein the DAC is a segmented or thermometer type configuration.

7. The method of claim 5 in a configuration wherein the at least one cell in addition to the LSB cell is the MSB cell, further including the step of selecting a magnitude of the third current input and the fourth current input that is greater than the current carried by the MSB if it was configured as a conventional cell.

8. A method for improving switching speeds in high resolution Digital to Analog Converters (DACs), the method comprising:
   providing a quantity of N cells including a Least Significant Bit (LSB) cell, a Most Significant Bit (MSB) cell and, N−2 cells ordered therebetween, wherein each of the N cells is configured to carry a differential current;
   fragmenting at least one cell into a first cell element and a second cell element, applying a first current input having a magnitude larger than the differential current and applying a second current input having a magnitude larger than the differential current; and
   wherein the difference between the magnitude of the first current input and the magnitude of the second current input approximately equals the differential current.

* * * * *